United States Patent
Patrizi

(10) Patent No.: US 9,385,655 B2
(45) Date of Patent: Jul. 5, 2016

(54) REGENERATIVE FREQUENCY MULTIPLIER

(71) Applicant: Raytheon Company, Waltham, MA (US)

(72) Inventor: Michael R. Patrizi, Waltham, MA (US)

(73) Assignee: Raytheon Company, Waltham, MA (US)

( * ) Notice: Subject to any disclaimer, the term of this patent is extended or adjusted under 35 U.S.C. 154(b) by 147 days.

(21) Appl. No.: 14/103,667

(22) Filed: Dec. 11, 2013

(65) Prior Publication Data

US 2015/0162875 A1 Jun. 11, 2015

(51) Int. Cl.
*H03B 19/00* (2006.01)
*H03K 5/00* (2006.01)
*H04B 1/403* (2015.01)

(52) U.S. Cl.
CPC ............ *H03B 19/00* (2013.01); *H03K 5/00006* (2013.01); *H04B 1/403* (2013.01)

(58) Field of Classification Search
CPC ........ H03K 5/00006; H03K 3/00; H03K 4/00
See application file for complete search history.

(56) References Cited

U.S. PATENT DOCUMENTS

| 2,831,116 | A | | 4/1958 | Hahnel |
| 3,137,459 | A | * | 6/1964 | Smith et al. .................. 244/192 |
| 4,538,148 | A | * | 8/1985 | Petitjean et al. ............. 342/201 |
| 4,631,500 | A | | 12/1986 | Rauscher |
| 7,508,275 | B1 | * | 3/2009 | Paniccia ......................... 331/16 |
| 8,655,934 | B2 | | 2/2014 | Petrovic et al. |

OTHER PUBLICATIONS

Ferre-Pikal et al.; Microwave Regenerative Frequency Dividers with Low Phase Noise; IEEE Transactions on Ultrasonics, Ferroelectrics, and Frequency Control; Jan. 1999; pp. 216-219; vol. 46, No. 1; IEEE.
Gupta et al.; A Novel Low Noise Regenerative Divide-By-Four Circuit; 2002 IEEE International Frequency Control Symposium and PDA Exhibition; May 2002; pp. 680-684; IEEE.
Karlquist; A Narrow-Band High Resolution Synthesizer Using a Direct Digital Synthesizer Followed by Repeated Dividing and Mixing; Frequency Control Symposium 1995. $49^{th}$., Proceedings of the 1995 IEEE International; May/Jun. 1995; 10 pages; Frequency Control Symposium 1995. $49^{th}$., Proceedings of the 1995 IEEE International; May 31-Jun. 2, 1995, San Francisco, California.
Momeni et al.; Regenerative Frequency Divider with Synchronous Fractional Outputs; 2007 IEEE Radio Frequency Integrated Circuits Symposium; Jun. 2007; pp. 717-720; IEEE.
Safarian et al.; A Study of High-Frequency Regenerative Frequency Dividers; http://www.docstoc.com/docs/87488511/A-Study-of-High-Frequency-Regenerative-Frequency-Dividers ; Upon knowledge and belief prior to Jul. 29, 2011; University of California, Irvine.
PCT Application PCT/US2014/060287; filing date Oct. 13, 2014; Raytheon Company; International Search Report mailed Dec. 22, 2014.

* cited by examiner

*Primary Examiner* — Ryan Jager

(57) ABSTRACT

A technology is provided for generating an output frequency. An input signal with a defined frequency may be received. The input signal may be split so that a first signal with the defined frequency of the input signal is received at a frequency multiplier and a second signal with the defined frequency of the input signal is received at a frequency mixer. The first signal may be multiplied by N, wherein N is a predefined integer. The first signal may be limited to a predetermined frequency and passed to the frequency mixer. The first signal and the second signal may be mixed to produce at least two mixed signals. A first output signal and a second output signal may be generated based on the at least two mixed signals.

24 Claims, 3 Drawing Sheets

REGENERATIVE FREQUENCY MULTIPLIER

BACKGROUND

A frequency synthesizer may perform frequency multiplication, frequency division and/or frequency mixing in order to generate an output signal with a frequency that is related to a frequency of the input signal ($F_0$). A frequency multiplier may generate an output signal that is a harmonic (i.e., multiple) of the input signal. For example, the output signal at the frequency multiplier may have a frequency of $2F_0$. A frequency divider may generate an output frequency that is a fraction of the input signal (e.g., the output signal may have a frequency of $F_0/n$, wherein n is an integer). A frequency mixer may mix two signals in order to calculate sum and difference frequency components of the two signals. Frequency multipliers, frequency dividers and/or frequency mixers may be included in numerous electronic systems in which input frequencies are transformed to output frequencies, such as in radio receivers, global position system (GPS) devices, radar systems, electronic warfare (EW) systems, mobile telephones, satellite receivers, etc.

BRIEF DESCRIPTION OF THE DRAWINGS

Features and advantages of the invention will be apparent from the detailed description which follows, taken in conjunction with the accompanying drawings, which together illustrate, by way of example, features of the invention; and, wherein.

Figure 1:
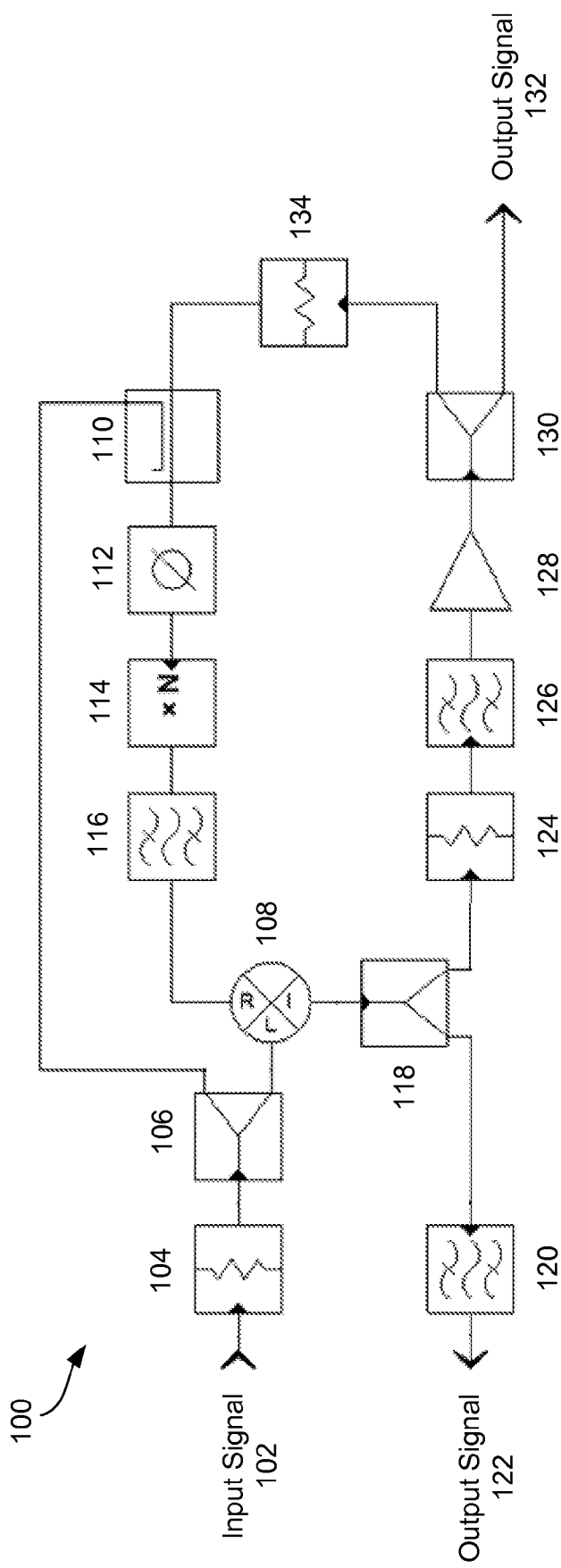
FIG. 1 is an example illustration of a regenerative frequency multiplier in accordance with an embodiment of the present invention.

Reference will now be made to the exemplary embodiments illustrated, and specific language will be used herein to describe the same. It will nevertheless be understood that no limitation of the scope of the invention is thereby intended.

DETAILED DESCRIPTION

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result.

An initial overview of technology embodiments is provided below and then specific technology embodiments are described in further detail later. This initial summary is intended to aid readers in understanding the technology more quickly but is not intended to identify key features or essential features of the technology nor is it intended to limit the scope of the claimed subject matter.

Regenerative frequency dividers, as known, may be included in frequency synthesizers and/or phase locked loops (PLLs) in order to generate an output signal with a frequency that is related to a frequency of an input signal. A regenerative frequency divider may be implemented in both analog and digital applications. For example, regenerative frequency dividers may be used for improving the performance of electronic countermeasures equipment, communications systems and laboratory instruments. In addition, regenerative frequency dividers may be key components in radio frequency (RF) and microwave systems. Furthermore, regenerative frequency dividers may be included in radar systems, electronic warfare (EW) systems, communication systems, etc.

In general, a regenerative frequency divider, as known, is a low-noise, non-linear analog feedback circuit. In one example, the regenerative frequency divider may include at least a frequency mixer, an amplifier, and a filter (e.g., a low-pass filter or a band-pass filter). The regenerative frequency divider may receive an input signal having a frequency of $F_0$. The input signal may travel through the feedback circuit a plurality of times and a stable output signal having a frequency of $$\frac{F_0}{2}$$

may be generated. The output signal of $$\frac{F_0}{2}$$

may be mixed with the input signal ($F_0$). The frequency mixer may generate sum and difference frequency components $$\left(\text{i.e., } \frac{F_0}{2} \text{ and } \frac{3F_0}{2}\right)$$

from the output signal of $$\frac{F_0}{2}$$

and the input signal of $F_0$. In other words, the frequency mixer may perform a plus-minus function with the input and output signals, such that $$\left(F_0 + \frac{F_0}{2}\right)$$

generates $$\frac{3F_0}{2}, \text{ and } \left(F_0 - \frac{F_0}{2}\right)$$

generates $$\frac{F_0}{2}.$$

In one example, the filter (e.g., the low-pass filter or the band pass filter) may remove the higher of the sum and difference frequencies. Thus, the filter may remove the sum frequency component $$\left(\text{i.e., }\frac{3F_0}{2}\right).$$

The difference frequency component $$\left(\text{i.e., }\frac{F_0}{2}\right)$$

may be amplified and fed back into the frequency mixer. In other words, the $$\frac{F_0}{2}$$

signal may be mixed with the input signal having the frequency of $F_0$, and continuously regenerated inside the closed loop of the feedback circuit. In an alternative configuration, the regenerative frequency divider may generate both $$\frac{3F_0}{2} \text{ and } \frac{F_0}{2}$$

as the output frequencies (rather than removing the $$\frac{3F_0}{2}$$

signal). Both the output frequencies of $$\frac{3F_0}{2} \text{ and } \frac{F_0}{2}$$

may be mixed with the input signal and continuously generated inside the closed loop of the circuit.

The closed-loop feedback nature of the regenerative frequency divider circuit can limit the output signals of the circuit to $$\frac{3F_0}{2} \text{ and } \frac{F_0}{2}.$$

As a result, the output signals of $$\frac{3F_0}{2} \text{ and } \frac{F_0}{2}$$

are very stable. Since the regenerative frequency divider is an analog frequency divider, the output signals are of low-noise and desirable for use in frequency synthesizers. However, the known regenerative frequency divider in the example above cannot generate a plurality of non-integer frequency multiples of the input signal. Nonetheless, many frequency synthesizer architectures may require generation of non-integer frequency multiples, such as ⅓ or ⅘ of the input signal.

Furthermore, known combinations of frequency dividers and frequency multipliers may be used to generate the non-integer frequency multiples (e.g., ⅓ or ⅘) of the input signal. For example, in order to generate an output signal with a frequency of 320 megahertz (MHz) from an input signal with a frequency of 240 MHz (i.e., a factor of ⅘), a series of times two (×2), divide by three (/3), and times two (×2) mathematical operations may be performed on the input signal. In other words, the 240 MHz may be multiplied by 2, divided by 3, and then multiplied by 2 in order to generate the 320 MHz. However, using the combination of frequency dividers and multipliers may employ a significant amount of RF circuitry and produce more noise when compared to the analog feedback circuit of the regenerative frequency divider which generates stable output signals of $$\frac{3F_0}{2} \text{ and } \frac{F_0}{2}.$$

Disclosed herein is a novrel regenerative frequency multiplier. As discussed in greater detail below, and unlike known devices and/or systems, the regenerative frequency multiplier may generate one or more output signals with frequencies that are non-integer frequency multiples of the input signal. The regenerative frequency multiplier is a low-noise, non-linear analog feedback circuit. The regenerative frequency multiplier may include a frequency multiplication stage which creates a "regenerative multiple" function within the regenerative frequency multiplier. In particular, the multiplication stage may be a frequency multiplier. The frequency multiplier can multiply an input signal by N, wherein N is a predefined integer. The signal produced at the frequency multiplier may be continuously regenerated inside the closed loop of the feedback circuit. In one example, the frequency transfer function of the regenerative frequency multiplier may be $$\frac{F_0}{(1+N)} \text{ and } \frac{F_0(1+2n)}{(1+N)}.$$

In other words, the output signals generated by the regenerative frequency multiplier may have frequencies of $$\frac{F_0}{(1+N)} \text{ and } \frac{F_0(1+2n)}{(1+N)}.$$

For N=1, the output signals have frequencies of $$\frac{F_0}{2} \text{ and } \frac{3F_0}{2}.$$

For N=2, the output signals have frequencies of $$\frac{F_0}{3} \text{ and } \frac{5F_0}{3}.$$

For N=3, the output signals have frequencies of $$\frac{F_0}{4} \text{ and } \frac{7F_0}{4}.$$

In other words, the regenerative frequency multiplier may use selected values of N in order to generate a plurality of non-integer frequency multiples of the input signal, unlike the regenerative frequency divider that was described above. In addition, the output signals are stable and contain minimal noise. In one example, the regenerative frequency multiplier may be self-starting and self-contained so that the output signal is automatically generated when the input signal is received at the regenerative frequency multiplier.

FIG. 1 is an illustration of a regenerative frequency multiplier 100. The regenerative frequency multiplier 100 may be a low-noise, non-linear analog feedback circuit. In one example, the regenerative frequency multiplier 100 may be self-contained and self-starting. In other words, the output signals 122 and 132 may be automatically generated when the regenerative frequency multiplier 100 receives the input signal 102.

An input signal 102 having a defined frequency of $F_0$ (e.g., 1000 MHz) may be received at the regenerative frequency multiplier 100. The input signal 102 may pass through an attenuator 104 which reduces a power level associated with the input signal 102. In other words, the attenuator 104 may provide a loss (or a gain of less than one). The input signal 102 may be split into two separate signals at the splitter 106. Thus, a first signal with the defined frequency of the input signal 102 may be received at a coupler 110 and a second signal with the defined frequency of the input signal 102 may be received at a frequency mixer 108. In other words, the first signal and the second signal may have the same frequency as the input signal 102 (e.g., 1000 MHz). In general, the two signals that are outputted at the splitter may each have the same frequency as the signal that is inputted into the splitter.

The first signal from the splitter 106 may pass through the coupler 110 and a phase shifter 112. When the input signal 102 is initially inputted into the regenerative frequency multiplier 100 (i.e., when time (T)=0), the coupler 110 may only receive the signal from the splitter 106. As discussed in greater detail below, when T>0, then the coupler 110 may receive an additional signal from an attenuator 134. The phase shifter 112 may shift a phase of the first signal by a defined number of degrees, such as 90 degrees. The phase shifter 112 may not affect the frequency of the first signal. For example, a 1000 MHz signal that enters the phase shifter 112 may remain a 1000 MHz signal when exiting the phase shifter 112. Thus, the frequency of the first may be $F_0$ when exiting the phase shifter 112.

The first signal may be received at a frequency multiplier 114. When T=0, the frequency multiplier 114 may be turned on upon receiving the first signal. The frequency multiplier may multiply the first signal (having the frequency of $F_0$) by N, wherein N is a predefined integer. As explained in greater detail below, the value of N (e.g., 2, 3 or 4) may be selected based on a desired output signal 122 or 132. The frequency multiplier 114 may contain a plurality of blocks (such as a block with an ×2 multiplier, a block with an ×3 multiplier, a block with an ×4 multiplier) and a switch may select an appropriate block based on the value of N. In the example when N=2, the frequency multiplier 114 may produce a first signal having a frequency of $2F_0$.

A band pass filter 116 may receive the first signal from the frequency multiplier 114 (e.g., the first signal having the frequency of $2F_0$). The band pass filter 116 may be configured to limit signals that can pass through the band pass filter 116 to a predetermined frequency. The predetermined frequency may depend on the value of N. In one example, the band pass filter 116 may set the frequency of signals that can pass through the band pass filter 116 to $$\frac{F_0(N)}{(1+N)}.$$

In addition, the band pass filter 116 may reject (i.e., attenuate) signals with frequencies that are outside a defined range. Therefore, the band pass filter 116 may limit the first signal to the frequency of $$\frac{F_0(N)}{(1+N)}$$

and the first signal having the frequency of $$\frac{F_0(N)}{(1+N)}$$

may pass through the band pass filter 116.

In the example, when N=2, the band pass filter 116 may receive the first signal having the frequency of $2F_0$, but limit the first signal to a frequency of $$\frac{2F_0}{3}.$$

In other words, the band pass filter 116 can limit the level of energy that is allowed to pass through the band pass filter 116. Thus, the frequency mixer 108 may receive noise at a frequency that is selected by the band pass filter 116 (e.g., $$\frac{2F_0}{3}$$

when N=2). In one configuration, the band pass filter 116 may include a plurality of band pass filters with various thresholds (e.g., a first band pass filter that can limit signals to a frequency of $$\frac{2F_0}{3},$$

and a second band pass filter that can limit signals to a frequency of $$\frac{3F_0}{4}),$$

and a switch may select an appropriate band pass filter based on the value of N.

The frequency mixer 108 may contain three ports—a local oscillator (L) port, a radio frequency (R) port, and an intermediate frequency (I) port. The L and R ports are input signal ports and the I port is an output signal port. The frequency mixer 108 may mix the first and second signals received at the R and L ports, respectively, and generate two mixed signals. In other words, each mixed signal may be produced from the first and second signals. The frequency mixer 108 may perform a plus-minus function with the first and second signals received at the R and L ports. Therefore, the two mixed signals may have a frequency that is either the sum (or difference) frequency of the first and second signals received at the R and L ports, respectively. In other words, $F_I=F_L\pm F_R$, wherein $F_I$ is the frequency of the signal at the I port, $F_L$ is the frequency of the signal at the L port, and $F_R$ is the frequency of the signal at the R port.

Thus, the first signal from the band pass filter 116 (i.e., the signal having a frequency of $$\frac{F_0(N)}{(1+N)})$$

may be received at the R port of the frequency mixer 108. In addition, the second signal (i.e., the signal having a frequency of $F_0$) may be received at the L port of the frequency mixer 108 from the splitter 106. The frequency mixer 108 may calculate $$\left(F_0 \pm \frac{F_0(N)}{(1+N)}\right)$$

based on the first and second signals being received at the R and L ports, respectively. In other words, the two mixed signals produced at the I port of the frequency mixer 108 may have frequencies of $$\left(F_0 + \frac{F_0(N)}{(1+N)}\right) \text{ and } \left(F_0 - \frac{F_0(N)}{(1+N)}\right).$$

In the example when N=2, the first signal from the band pass filter 116 may have a frequency of $$\frac{2F_0}{3}$$

and the second signal from the splitter 106 may have a frequency of $F_0$. The frequency mixer 108 may perform a plus-minus function on the first and second signals of $F_0$ and $$\frac{2F_0}{3}.$$

In other words, the frequency mixer 108 may calculate the mixed signals of $$\left(F_0 + \frac{2F_0}{3}\right) \text{ and } \left(F_0 - \frac{2F_0}{3}\right),$$

or $$\frac{5F_0}{3} \text{ and } \frac{F_0}{3},$$

respectively, using the first and second signals. A splitter 118 may split the two mixed signals coming from the I port of the frequency mixer 108, such that the mixed signals of $$\left(F_0 + \frac{F_0(N)}{(1+N)}\right) \text{ and } \left(F_0 - \frac{F_0(N)}{(1+N)}\right)$$

are each received at the band pass filter 120, as well as the attenuator 124.

In one example, the band pass filter 120 may be configured to limit the mixed signals that can pass through the band pass filter 120. In one example, the band pass filter 120 may allow only the mixed signal having the frequency of $$\left(F_0 + \frac{F_0(N)}{(1+N)}\right)$$

to pass through the band pass filter 120. The mixed signal having the frequency of $$\left(F_0 + \frac{F_0(N)}{(1+N)}\right)$$

may also be known as a first desired signal. In addition, the band pass filter 120 may reject (i.e., attenuate) the mixed signal having the frequency of $$\left(F_0 - \frac{F_0(N)}{(1+N)}\right).$$

In other words, the band pass filter 120 may reject a lower signal out of the two mixed signals that were received from the splitter 118.

The first desired signal having the frequency of $$\left(F_0 + \frac{F_0(N)}{(1+N)}\right),$$

also known as the upper side band, may pass through the band pass filter 120 and be outputted from the regenerative frequency multiplier 100 as the output signal 122. In addition, the band pass filter 120 may prevent the lower signal out of the two mixed signals (i.e., $F_0 - \frac{F_0(N)}{(1+N)}$)

from passing through the band pass filter 120, so that the lower signal continues to propagate around the closed feedback loop of the regenerative frequency multiplier 100.

In one example, the two mixed signals having the frequencies of $$F_0 + \frac{F_0(N)}{(1+N)} \text{ and } F_0 - \frac{F_0(N)}{(1+N)}$$

may pass through the attenuator 124, which reduces the power levels associated with the two mixed signals. The two mixed signals may be received at the band pass filter 126. The band pass filter 126 may be configured to limit the mixed signals that can pass through the band pass filter 126. In one example, the band pass filter 126 may allow only the mixed signal having the frequency of $$\left(F_0 - \frac{F_0(N)}{(1+N)}\right)$$

to pass through the band pass filter 126. The mixed signal having the frequency of $$\left(F_0 - \frac{F_0(N)}{(1+N)}\right)$$

may also be known as a second desired signal. In addition, the band pass filter 126 may reject (i.e., attenuate) the mixed signal having the frequency of $$\left(F_0 + \frac{F_0(N)}{(1+N)}\right).$$

In other words, the band pass filter 126 may reject a higher signal out of the two mixed signals that were received from the attenuator 124.

In the example when N=2, the splitter 118 may split the mixed signals coming from the I port of the frequency mixer 108, such that the two mixed signals having frequencies of $$\frac{5F_0}{3} \text{ and } \frac{F_0}{3}$$

are both received at the band pass filter 120, as well as the attenuator 124. The band pass filter 120 may limit the mixed signals which can pass through the band pass filter 120 to the first desired signal of $$\frac{5F_0}{3},$$

and reject the signal having the frequency of $$\frac{F_0}{3}.$$

The first desired signal of $$\frac{5F_0}{3}$$

may pass through the band pass filter 120 and be outputted from the regenerative frequency multiplier as the output signal 122. In addition, the band pass filter 126 may limit the mixed signals which can pass through the band pass filter 126 to the second desired signal of $$\frac{F_0}{3},$$

and reject the signal having the frequency of $$\frac{5F_0}{3}.$$

An amplifier 128 may amplify the second desired signal from the band pass filter 126

(i.e., $F_0 - \frac{F_0(N)}{(1+N)}$)

in order to create a closed loop gain. In other words, the amplifier 128 may increase a power level associated with the second desired signal (or produce a gain that is greater than one). A splitter 130 may split the signal received from the amplifier 128, such that a first portion of the second desired signal having the frequency of $$F_0 - \frac{F_0(N)}{(1+N)})$$

may be outputted from the regenerative frequency multiplier 100 as the output signal 132. In addition, a second portion of the second desired signal having the frequency of $$F_0 - \frac{F_0(N)}{(1+N)})$$

may be received at an attenuator 134. The output signal 132 may also be known as the lower side band. The attenuator 134 may reduce a power level associated with the second portion of the second desired signal having the frequency of $$F_0 - \frac{F_0(N)}{(1+N)}),$$

and then the second portion of the second desired signal may be received at the coupler 110. The coupler 110 may also receive the first signal having the frequency of $F_0$ from the splitter 106.

In addition, the signals having frequencies of $F_0$ and $$F_0 - \frac{F_0(N)}{(1+N)})$$

may both pass through the phase shifter 112, the frequency multiplier 114, and the band pass filter 116. The frequency multiplier 114 may multiply both of the signals having frequencies of $F_0$ and $$F_0 - \frac{F_0(N)}{(1+N)})$$

by N, wherein N is the predefined integer. Therefore, the signals may have frequencies of $NF_0$ and $N\times$ $$\left[F_0 - \frac{F_0(N)}{(1+N)}\right]$$

when received at the band pass filter 116. As previously discussed, the band pass filter 116 may be configured to limit signals that can pass through the band pass filter 116 to a predetermined frequency. In addition, the band pass filter 116 may reject signals that are outside a defined range. Thus, the band pass filter 116 may set the frequency of signals that can pass through the band pass filter 116 to $$\frac{F_0(N)}{(1+N)}.$$

In addition, the band pass filter 116 may reject the $NF_0$ signal.

The frequency mixer 108 may mix the first signal having the frequency of $F_0$ that is received at the L port and the $$\frac{F_0(N)}{(1+N)}$$

signal that is received at the R port. The regenerative frequency multiplier 100 may generate the output signals 122 and 132 based on, in part, the mixed signals that are produced at the frequency mixer 108. Therefore, signals that are passed through the frequency multiplier 114 (among other components in the regenerative frequency multiplier 100) are continuously regenerated inside the closed loop of the feedback circuit. In other words, the regenerative frequency multiplier 100 may continuously generate the output signals 122 and 132 of $$F_0 + \frac{F_0(N)}{(1+N)} \text{ and } F_0 - \frac{F_0(N)}{(1+N)}),$$

respectively, from the input signal 102 of $F_0$. In addition, the output signals 122 and 132 can be non-integer frequency multiples of the input signal 102.

Figure 2:
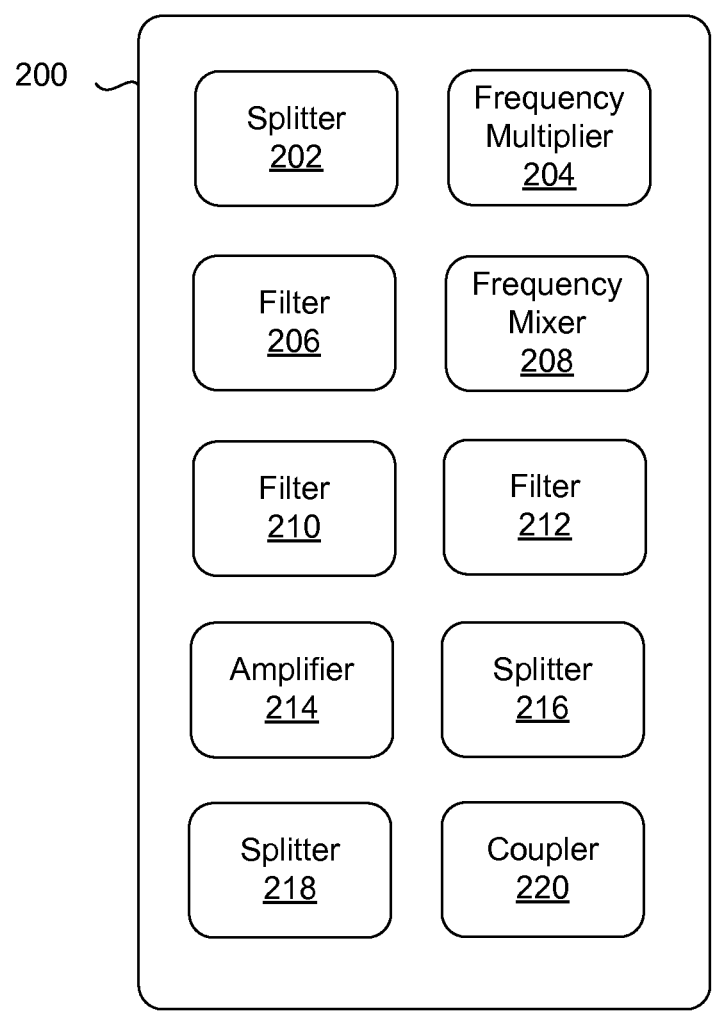
FIG. 2 is a block diagram of an exemplary system for generating one or more output signals based on an input signal in accordance with an embodiment of the present invention.

FIG. 2 is a diagram of an exemplary system 200 for generating one or more output signals based on an input signal. The system 200 may include splitters 202, 216 and 218, a frequency multiplier 204, filters 206, 210 and 212, a frequency mixer 208, an amplifier 214, and a coupler 220. The filters 206, 210 and 212 may be selected from a group consisting of a low pass filter, a high pass filter, and a band pass filter. In one example, the splitter may split the input signal into a first signal and a second signal, wherein the first signal and the second signal have a substantially same frequency as the input signal. The multiplier 204 may multiply the first signal by N, wherein N is a predefined integer. The filter 206 may limit the first signal to a predetermined frequency. In addition, the mixer 208 may produce at least two mixed signals using the first signal and the second signal. The at least two mixed signals may be used to generate a first output signal and a second output signal.

In one example, the splitter 216 may split the at least two mixed signals that are received from the frequency mixer 208. The filter 210 may allow a first desired signal from the at least two mixed signals received from the splitter 216 to pass through the filter 210, wherein the first output signal is generated from the first desired signal. The filter 212 may allow a second desired signal from the at least two mixed signals received from the splitter 216 to pass through the filter 212. The amplifier 214 may amplify the second desired signal. The splitter 218 may split the second desired signal so that a first portion of the second desired signal is used to produce the second output signal and a second portion of the second desired signal is fed back into the frequency mixer 208.

In one example, the coupler 220 may provide the second portion of the second desired signal and the first signal received from the splitter 202 to the frequency multiplier 204. In addition, the first output signal may have a frequency of $$\frac{F_0}{(1+N)}$$

and the second output signal may have a frequency of $$\frac{F_0(1+2N)}{(1+N)},$$

wherein $F_0$ is the input frequency. The first output signal and the second output signal may be non-integer frequency multiples of the input signal.

In accordance with one embodiment of the present invention, a method for generating an output frequency is disclosed. The method can comprise receiving an input signal with a defined frequency. The method can also comprise splitting the input signal so that a first signal with the defined frequency of the input signal is received at a frequency multiplier and a second signal with the defined frequency of the input signal is received at a frequency mixer. The method can further comprise multiplying the first signal by N, wherein N is a predefined integer. In addition, the method can comprise limiting the first signal to a predetermined frequency and passing the first signal with the predetermined frequency to the frequency mixer. The method can comprise mixing the first signal and the second signal to produce at least two mixed signals. The method can further comprise generating a first output signal and a second output signal based on the at least two mixed signals.

In one example, the method further comprises generating the first output signal to have a frequency of $$\frac{F_0}{(1+N)}$$

and the second output signal to have a frequency of $$\frac{F_0(1+2N)}{(1+N)},$$

wherein $F_0$ is the defined frequency of the input signal. In addition, the method can further comprise generating the first output signal from a first desired signal, wherein the first desired signal is selected from the at least two mixed signals.

In one example, generating the second output signal further comprises selecting a second desired signal from the at least two mixed signals; amplifying the second desired signal to increase a power level associated with the second desired signal; and splitting the second desired signal so that a first portion of the second desired signal is used to produce the second output signal.

In one configuration, the method further comprises splitting the second desired signal so that a second portion of the second desired signal is fed back into the frequency multiplier. In one example, the first output signal and the second output signal are non-integer frequency multiples of the input signal. In addition, the method can comprise generating the first output signal and the second output signal in a regenerative frequency multiplier. In one example, the method includes limiting the first signal to the predetermined frequency of $$\frac{F_0(N)}{(1+N)},$$

wherein $F_0$ is the defined frequency of the input signal.

Figure 3:
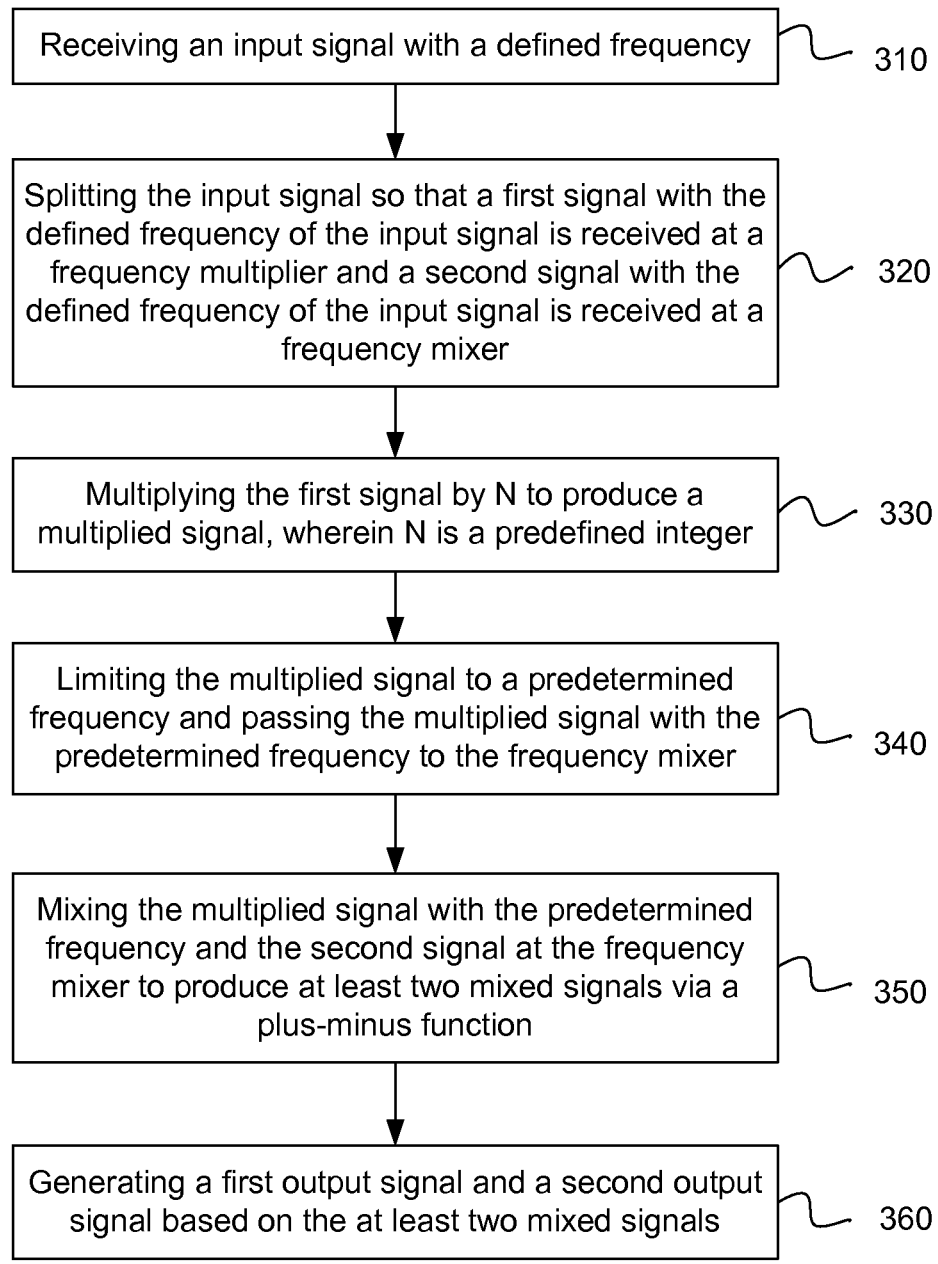
FIG. 3 depicts a flow chart of a method for generating an output frequency in accordance with an embodiment of the present invention.

FIG. 3 depicts a flow chart of a method for generating an output frequency in accordance with an embodiment of the present invention. The method can include the operation of receiving an input signal with a defined frequency, as in block 310. The method can include the operation of splitting the input signal so that a first signal with the defined frequency of the input signal is received at a frequency multiplier and a second signal with the defined frequency of the input signal is received at a frequency mixer, as in block 320. The method can include the operation of multiplying the first signal by N to produce a multiplied signal, wherein N is a predefined integer, as in block 330. The method can include the operation of limiting the multiplied signal to a predetermined frequency and passing the multiplied signal with the predetermined frequency to the frequency mixer, as in block 340. The method can include the operation of mixing the multiplied signal with the predetermined frequency and the second signal at the frequency mixer to produce at least two mixed signals via a plus-minus function, as in block 350. The method can include the operation of generating a first output signal and a second output signal based on the at least two mixed signals, as in block 360.

Various techniques, or certain aspects or portions thereof, may take the form of program code (i.e., instructions) embodied in tangible media, such as floppy diskettes, CD-ROMs, hard drives, or any other machine-readable storage medium wherein, when the program code is loaded into and executed by a machine, such as a computer, the machine becomes an apparatus for practicing the various techniques. In the case of program code execution on programmable computers, the computing device may include a processor, a storage medium readable by the processor (including volatile and non-volatile memory and/or storage elements), at least one input device, and at least one output device. The volatile and non-volatile memory and/or storage elements may be a RAM, EPROM, flash drive, optical drive, magnetic hard drive, or other medium for storing electronic data. The base station and mobile station may also include a transceiver module, a counter module, a processing module, and/or a clock module or timer module. One or more programs that may implement or utilize the various techniques described herein may use an application programming interface (API), reusable controls, and the like. Such programs may be implemented in a high level procedural or object oriented programming language to communicate with a computer system. However, the program(s) may be implemented in assembly or machine language, if desired. In any case, the language may be a compiled or interpreted language, and combined with hardware implementations.

It should be understood that many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more physical or logical blocks of computer instructions, which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. The modules may be passive or active, including agents operable to perform desired functions.

Reference throughout this specification to "an example" means that a particular feature, structure, or characteristic described in connection with the example is included in at least one embodiment of the present invention. Thus, appearances of the phrases "in an example" in various places throughout this specification are not necessarily all referring to the same embodiment.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention may be referred to herein along with alternatives for the various components thereof. It is understood that such embodiments, examples, and alternatives are not to be construed as defacto equivalents of one another, but are to be considered as separate and autonomous representations of the present invention.

Furthermore, the described features, structures, or characteristics may be combined in any suitable manner in one or more embodiments. In the foregoing description, numerous specific details are provided, such as examples of layouts, distances, network examples, etc., to provide a thorough understanding of embodiments of the invention. One skilled in the relevant art will recognize, however, that the invention can be practiced without one or more of the specific details, or with other methods, components, layouts, etc. In other instances, well-known structures, materials, or operations are not shown or described in detail to avoid obscuring aspects of the invention.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

What is claimed is:

1. A method for generating an output frequency, the method comprising:
   receiving an input signal with a defined frequency;
   splitting the input signal so that a first signal with the defined frequency of the input signal is received at a frequency multiplier and a second signal with the defined frequency of the input signal is received at a frequency mixer;
   multiplying the first signal by N to produce a multiplied signal, wherein N is a predefined integer;
   limiting the multiplied signal to a predetermined frequency and passing the multiplied signal with the predetermined frequency to the frequency mixer;
   mixing the multiplied signal with the predetermined frequency and the second signal at the frequency mixer to produce at least two mixed signals via a plus-minus function; and
   generating a first output signal and a second output signal based on the at least two mixed signals.

2. The method of claim 1, further comprising generating the first output signal to have a frequency of $$\frac{F_0}{(1+N)}$$

and the second output signal to have a frequency of $$\frac{F_0(1+2N)}{(1+N)},$$

wherein $F_0$ is the defined frequency of the input signal.

3. The method of claim 1, further comprising generating the first output signal from a first desired signal, wherein the first desired signal is selected from the at least two mixed signals.

4. The method of claim 1, wherein generating the second output signal further comprises:
   selecting a second desired signal from the at least two mixed signals;
   amplifying the second desired signal to increase a power level associated with the second desired signal; and
   splitting the second desired signal so that a first portion of the second desired signal is used to produce the second output signal.

5. The method of claim 4, further comprising splitting the second desired signal so that a second portion of the second desired signal is fed back into the frequency multiplier.

6. The method of claim 1, wherein the first output signal and the second output signal are non-integer frequency multiples of the input signal.

7. The method of claim 1, further comprising generating the first output signal and the second output signal in a regenerative frequency multiplier.

8. The method of claim 1, further comprising limiting the multiplied signal to the predetermined frequency of $$\frac{F_0(N)}{(1+N)},$$

wherein $F_0$ is the defined frequency of the input signal.

9. A system for generating one or more output signals based on an input signal, the system comprising:
   a first splitter to split the input signal into a first signal and a second signal, wherein the first signal and the second signal have a substantially same frequency as the input signal;
   a frequency multiplier to multiply the first signal by N to produce a multiplied signal, wherein N is a predefined integer;
   a first filter to limit the multiplied signal to a predetermined frequency; and
   a frequency mixer to produce at least two mixed signals via a plus-minus function using the multiplied signal with the predetermined frequency and the second signal, wherein the at least two mixed signals are used to generate a first output signal and a second output signal.

10. The system of claim 9, further comprising a second splitter to split the at least two mixed signals that are received from the frequency mixer.

11. The system of claim 10, further comprising a second filter to allow a first desired signal from the at least two mixed signals received from the second splitter to pass through the second filter, wherein the first output signal is generated from the first desired signal.

12. The system of claim 10, further comprising:
   a third filter to allow a second desired signal from the at least two mixed signals received from the second splitter to pass through the third filter;
   an amplifier to amplify the second desired signal; and
   a third splitter to split the second desired signal so that a first portion of the second desired signal is used to produce the second output signal and a second portion of the second desired signal is fed back into the frequency mixer.

13. The system of claim 12, further comprising a coupler to provide the second portion of the second desired signal and the first signal received from the first splitter to the frequency multiplier.

14. The system of claim 9, wherein the first output signal has a frequency of $$\frac{F_0}{(1+N)}$$

and the second output signal has a frequency of $$\frac{F_0(1+2N)}{(1+N)},$$

wherein $F_0$ is the input frequency.

15. The system of claim 9, wherein the first output signal and the second output signal are non-integer frequency multiples of the input signal.

16. The regenerative frequency multiplier of claim 15, wherein the first output signal and the second output signal are generated in a self-starting and self-contained regenerative frequency multiplier.

17. A regenerative frequency multiplier, comprising:
a first splitter to split an input signal into a first signal and a second signal, wherein the first signal and the second signal have a substantially same frequency as the input signal;
a frequency multiplier to multiply the first signal by N to produce a multiplied signal, wherein N is a predefined integer;
a first band pass filter to limit the multiplied signal to a predetermined frequency; and
a frequency mixer to produce at least two mixed signals using the multiplied signal with the predetermined frequency and the second signal via a plus-minus function, wherein the at least two mixed signals are used to generate a first output signal and a second output signal.

18. The regenerative frequency multiplier of claim 17, further comprising a second splitter to split the at least two mixed signals that are received from the frequency mixer.

19. The regenerative frequency multiplier of claim 18, further comprising a second band pass filter to allow a first desired signal from the at least two mixed signals received from the second splitter to pass through the second band pass filter, wherein the first output signal is generated from the first desired signal.

20. The regenerative frequency multiplier of claim 18, further comprising:
a third band pass filter to allow a second desired signal from the at least two mixed signals received from the second splitter to pass through the third band pass filter;
an amplifier to amplify the second desired signal; and
a third splitter to split the second desired signal so that a first portion of the second desired signal is used to produce the second output signal and a second portion of the second desired signal is fed back into the frequency mixer.

21. The regenerative frequency multiplier of claim 17, wherein the first output signal has a frequency of $$\frac{F_0}{(1+N)}$$

and the second output signal has a frequency of $$\frac{F_0(1+2N)}{(1+N)},$$

wherein $F_0$ is the input frequency.

22. The regenerative frequency multiplier of claim 17, wherein the first band pass filter is configured to limit the multiplied signal to the predetermined frequency of $$\frac{F_0(N)}{(1+N)},$$

wherein $F_0$ is a frequency of the input signal.

23. The regenerative frequency multiplier of claim 17, further comprising one or more attenuators to reduce a power level associated with one or more signals in the regenerative frequency multiplier.

24. The regenerative frequency multiplier of claim 17, further comprising a phase shifter to shift a phase associated with one or more signals being provided to the frequency multiplier by a defined number of degrees.

* * * * *